United States Patent
Berke et al.

(10) Patent No.: US 9,955,568 B2
(45) Date of Patent: Apr. 24, 2018

(54) STRUCTURE TO DAMPEN BARREL RESONANCE OF UNUSED PORTION OF PRINTED CIRCUIT BOARD VIA

(71) Applicant: Dell Products, LP, Round Rock, TX (US)

(72) Inventors: Stuart Allen Berke, Austin, TX (US); Sandor Farkas, Round Rock, TX (US); Bhyrav M. Mutnury, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 668 days.

(21) Appl. No.: 14/163,389

(22) Filed: Jan. 24, 2014

(65) Prior Publication Data

US 2015/0216046 A1 Jul. 30, 2015

(51) Int. Cl.
  *H05K 3/42* (2006.01)
  *H05K 1/02* (2006.01)
  *H05K 1/09* (2006.01)

(52) U.S. Cl.
  CPC .......... *H05K 1/0251* (2013.01); *H05K 1/09* (2013.01); *H05K 3/429* (2013.01); *H05K 2201/0338* (2013.01); *H05K 2201/09509* (2013.01); *H05K 2201/09536* (2013.01); *Y10T 29/49004* (2015.01)

(58) Field of Classification Search
  None
  See application file for complete search history.

(56) References Cited

U.S. PATENT DOCUMENTS

| | | | | |
|---|---|---|---|---|
| 4,882,454 A * | 11/1989 | Peterson | ............. | H05K 1/0206 174/252 |
| 5,819,401 A * | 10/1998 | Johannes | ............... | H05K 3/368 174/262 |
| 6,118,350 A * | 9/2000 | Gupta | ................. | G06F 13/4086 257/536 |
| 6,452,117 B2 * | 9/2002 | Curcio | .................. | H01L 21/486 174/260 |
| 6,465,084 B1 * | 10/2002 | Curcio | ................... | H05K 3/462 174/255 |
| 6,518,509 B1 * | 2/2003 | Galasco | ................... | H05K 1/05 174/256 |
| 6,613,413 B1 * | 9/2003 | Japp | ........................ | H05K 3/38 174/255 |
| 6,639,155 B1 * | 10/2003 | Bupp | ................ | H01L 23/49822 174/255 |
| 7,196,906 B1 * | 3/2007 | Alexander | ............. | H05K 1/024 361/760 |
| 7,791,897 B2 * | 9/2010 | Das | ........................ | H05K 1/162 174/255 |
| 8,143,530 B1 * | 3/2012 | Das | ........................ | B32B 37/02 174/250 |

(Continued)

*Primary Examiner* — Xanthia C Cunningham
(74) *Attorney, Agent, or Firm* — Larson Newman, LLP

(57) ABSTRACT

A printed circuit board includes a first trace, a second trace, and a first via. The first trace is in a first conductive layer. The second trace is in a second conductive layer. The first via interconnects the first trace and the second trace, and communicates a first signal from the first trace to the second trace through a third conductive layer. The third conductive layer has a higher impedance than the first conductive layer and the second conductive layer.

16 Claims, 4 Drawing Sheets

(56) References Cited

U.S. PATENT DOCUMENTS

| | | | |
|---|---|---|---|
| 8,242,384 B2* | 8/2012 | Cases | H05K 1/0251 174/250 |
| 8,289,101 B2 | 10/2012 | Bandholz et al. | |
| 8,542,494 B2* | 9/2013 | Mutnury | H05K 1/024 361/748 |
| 8,569,873 B2 | 10/2013 | Mutnury et al. | |
| 8,889,999 B2* | 11/2014 | Thurairajaratnam | H05K 1/024 174/261 |
| 9,024,208 B2* | 5/2015 | Mutnury | H05K 1/115 174/262 |
| 2002/0108780 A1* | 8/2002 | Blackwell | H01L 23/50 174/262 |
| 2002/0139578 A1* | 10/2002 | Alcoe | H01L 23/49822 174/262 |
| 2003/0141107 A1* | 7/2003 | Burton | H01L 23/66 174/261 |
| 2003/0215567 A1* | 11/2003 | Sato | C08F 283/10 174/257 |
| 2004/0231885 A1* | 11/2004 | Borland | H05K 1/162 174/260 |
| 2005/0039950 A1* | 2/2005 | Chan | H01L 25/0652 174/262 |
| 2006/0002097 A1* | 1/2006 | Borland | H05K 1/162 361/763 |
| 2006/0090933 A1 | 5/2006 | Wig et al. | |
| 2007/0091581 A1* | 4/2007 | Gisin | H05K 1/023 361/782 |
| 2007/0132527 A1 | 6/2007 | Chen | |
| 2007/0139063 A1* | 6/2007 | Cai | H05K 1/023 361/763 |
| 2008/0087459 A1* | 4/2008 | Das | H05K 1/167 174/260 |
| 2008/0087460 A1* | 4/2008 | Fung | H05K 1/0251 174/262 |
| 2008/0277153 A1* | 11/2008 | Teshome | H05K 1/0216 174/262 |
| 2008/0316723 A1* | 12/2008 | Borland | H05K 1/162 361/763 |
| 2009/0049414 A1* | 2/2009 | Mutnury | G06F 17/5068 716/132 |
| 2009/0200063 A1* | 8/2009 | Omerovic | H01T 4/08 174/250 |
| 2009/0229859 A1* | 9/2009 | Oprea | H05K 1/0218 174/250 |
| 2009/0294168 A1* | 12/2009 | Pai | H05K 1/0251 174/266 |
| 2009/0295498 A1 | 12/2009 | Shan et al. | |
| 2010/0064180 A1 | 3/2010 | Farkas et al. | |
| 2010/0276192 A1* | 11/2010 | Pai | H05K 1/115 174/266 |
| 2012/0068322 A1* | 3/2012 | Hanabe | H01L 23/49822 257/676 |
| 2012/0112868 A1* | 5/2012 | Wu | H01F 5/003 336/200 |
| 2012/0215515 A1* | 8/2012 | Norte | H05K 1/0251 703/14 |
| 2012/0228014 A1* | 9/2012 | Das | H05K 1/162 174/260 |
| 2012/0312589 A1* | 12/2012 | Balcome | H05K 3/429 174/258 |
| 2013/0098671 A1* | 4/2013 | Thurairajaratnam | H05K 1/024 174/266 |
| 2013/0112465 A1* | 5/2013 | Duvanenko | H05K 1/0216 174/260 |
| 2013/0114218 A1* | 5/2013 | Itagaki | H01L 23/48 361/748 |
| 2013/0328645 A1* | 12/2013 | Na | H01P 1/203 333/204 |

\* cited by examiner

US 9,955,568 B2

STRUCTURE TO DAMPEN BARREL RESONANCE OF UNUSED PORTION OF PRINTED CIRCUIT BOARD VIA

FIELD OF THE DISCLOSURE

The present disclosure generally relates to information handling systems, and more particularly relates to the construction of printed circuit boards for information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, networking systems, and data storage systems.

An information handling system in a particular installation may use one or more printed circuit boards communicating signals between hardware components.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings. However, other teachings may be utilized in this application, as well as in other applications and with several different types of architectures such as distributed computing architectures, client or server architectures, or middleware server architectures and associated components.

Figure 1:
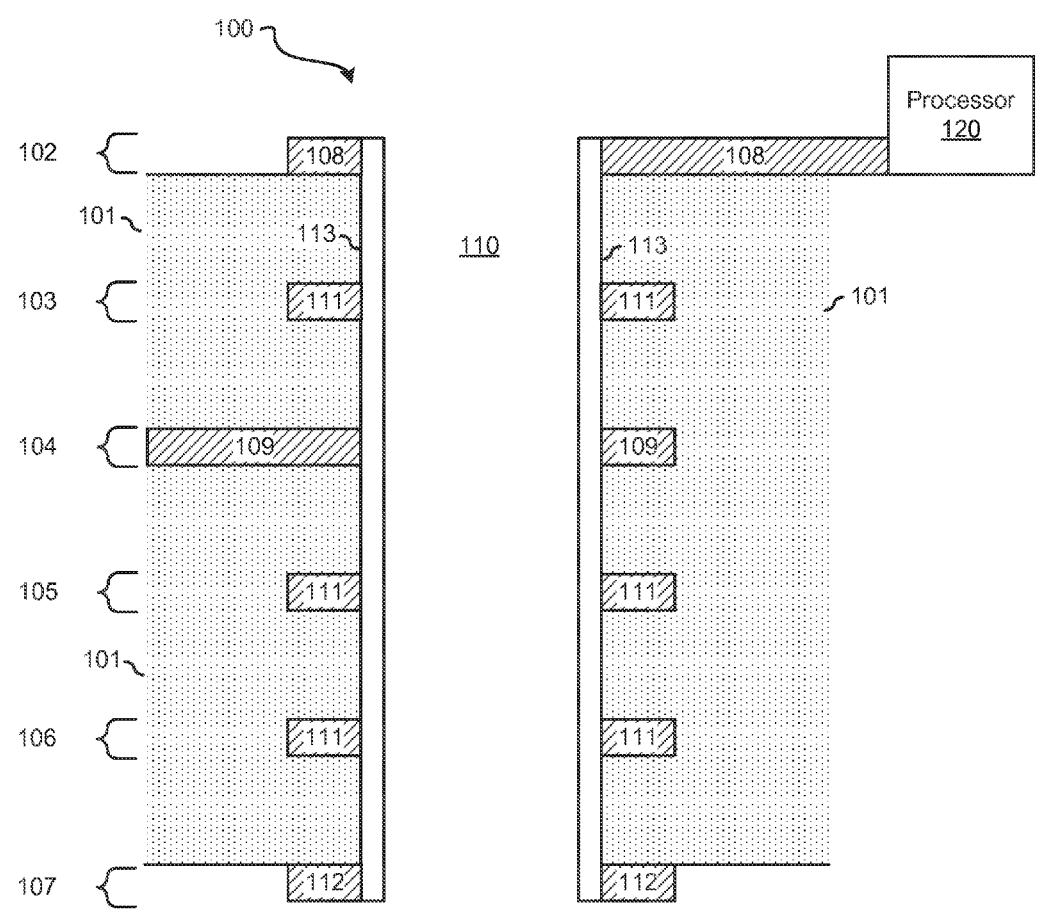
FIG. 1 is a diagram of a cross section of a printed circuit board for an information handling system according to an embodiment of the present disclosure.

FIG. 1 shows a cross-section diagram of a multi-layer printed circuit board 100 of an information handling system 10. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Printed circuit board 100 can interconnect components of an information handling system. Components of the information handling system, such as a processor and other integrated circuit devices, discrete elements (for example, transistors, resistors, capacitors, and inductors), or sub-assemblies (for example, connectors and displays) can be mechanically attached to printed circuit board 100. The mechanical attachments can also function as electrical connections. The interconnections between the components can be created by forming metal traces in trace layers 102 and 107 on the top and bottom surfaces, respectively, of printed circuit board 100 and traces in trace layers 103-106 encased within printed circuit board 100 by a material 101. In an embodiment, material 101 can be composed of glass cloth and a resin material. Material 101, including trace layers 102-107 can be constructed by a lamination process well know in the art. Printed circuit board 100 has metal trace 108 on trace layer 102 and metal trace 109 on trace layer 104. Trace layers 103 and 105-107 of printed circuit board 100 do not have metal traces carrying signals to via 110, but can have metal 111 and metal 112 surrounding the via 110. Metal 111 and metal 112 can be deposited during the manufacturing process for printed circuit board 100.

In an embodiment, the metal trace 108 can be coupled to a processor 120 of the information handling system 10. Metal traces 108 and 109 of printed circuit board 100 are connected by via 110. Vias are holes drilled vertically through printed circuit board 100 and, when plated with a conductive material, provide an electrical connection between metal traces on different trace layers. An electrical connection including via 110 can provide a signal path between the components of the information handling system 10, where a signal source of a first component, such as the processor 120, sends an information signal to a signal load of a second component. An electrical connection between the components of the information handling system 10 can communicate information signals of different types, including component power, data signals, control signals, clock signals, other signals, or any combination thereof. Printed circuit board 100 can include separate signal paths communicating signals having a plurality of types. In an embodiment, the metal trace 108 can receive signals from the processor 120 of the information handling system 10 and provide the signals to a signal source of the information handling system 10 connected to the metal trace 109 through the via 110.

Vias in printed circuit boards can be of a variety of via types, such as through vias, buried vias, and blind vias. Via 110 of printed circuit board 100 is an example of a through via, which passes through all of the trace layers of a printed circuit board. A buried via passes only through embedded trace layers of a printed circuit board but does not pass through the top and bottom trace layers. For example, a buried via of printed circuit board 100 would pass through trace layers 103-106, but would not pass through trace layers 102 and 107. A blind via passes through a top trace layer or a bottom trace layer, but not both a top and a bottom trace layer. For clarity, the present disclosure is illustrated only using through vias, but those skilled in the art will appreciate that the teachings contained herein can be applied to buried vias and to blind vias as well as to through vias.

Printed circuit board 100 illustrates a signal path including metal trace 108 on trace layer 102, via 110 plated with conductive material 113, and metal trace 109 on trace layer 104. A signal communicated from metal trace 108 to via 110 will be divided at trace layer 104. A portion of the signal will be communicated along metal trace 109, and another portion will continue through the portion of via 110 between trace layer 104 and trace layer 107. At trace layer 107, the via 110 is not connected to a metal trace. A portion of a via between a trace layer having a connection to a metal trace and a trace layer at an end of a via may be referred to herein as a "via stub." An end of a via stub not connected to a metal trace may be referred to as a "stub end" of the via. A signal reaching a stub end of a via stub can be reflected and travel back up the via in the direction from trace layer 107 to trace layer 102. This reflected signal can combine with a non-reflected signal traveling down the via, in the direction from trace layer 102 to trace layer 107. The resulting combined signal can leave the via through a metal trace.

The combining of signal in the printed circuit board 100 will be described with respect to FIG. 1, a first portion of a signal entering via 110 from metal trace 108 will exit via 110 directly through metal trace 109. A second portion of the signal will continue through the via 110 to trace layer 107 and be reflected by the stub end of the via. The reflected second portion of the signal can then combine with the first portion and exit via 110 through metal trace 109. Characteristics of the combined signal exiting via 110 at metal trace 109 can depend, at least in part, on the frequencies present in the signal, on the physical characteristics of the via stub, and on the electrical characteristics of the via. In an embodiment, a strength of a signal passing through a via having a via stub can be attenuated based on the length of the via stub, the conductivity of the plating of the via stub and a frequency of the signal.

A signal can be propagated through a via stub plated with a highly conductive material with relatively little resistive loss. A via stub having a length equal to a quarter wavelength of a frequency in a signal can cause the signal to travel a half of a wavelength from the metal trace at which the signal exits the via to the stub end and back to the metal trace for a total distance of a half wavelength. This half wavelength travel can have the effect of shifting the phase of the signal by 180 degrees. This effect can be referred to as a "resonance" of the via stub. The 180 degree phase-shifted reflected signal has a maximum value at a time when the signal has a minimum value, and has a minimum value at a time when the signal has a maximum value.

When the conductivity of the via plating is high, the reflected signal has approximately the same strength at the metal trace as the un-reflected signal. As stated above, the combined signal exiting the via at the metal trace is a combination of the original signal and the reflected signal (which in this example is 180 degree phase-shifted from the original signal). Thus, frequency components of the combined signal can be highly attenuated at a first frequency whose wavelength is approximately four times the length of the via stub. Signal frequency components that are odd multiples of the first frequency can also be highly attenuated.

In an embodiment, the resonance of a via stub can be dampened by plating the via with a material having a lower conductivity. For example, a via can be plated with tin, which has a conductivity of approximately $8 \times 10^{-6}$ siemens/meter (S/m) while copper has a conductivity of approximately $6 \times 10^{-7}$ S/m. Thus, tin can be referred to as a "lossy" medium as compared to copper. In an embodiment, a suitable electrical connection between trace layers of a printed circuit board is made by approximately 25 microns of plating on the wall of a via. Such a thickness can be achieved by an electroless plating process. An electroless tin plating process can chemically deposit a layer of tin on the wall of a via. In other embodiment, other materials, including alloys, compatible with a plating process for vias and having suitable conductivities can be used with the present disclosure. In an embodiment, a suitable conductivity for a low conductivity material can be approximately $1 \times 10^{-5}$ S/m.

Plating a via with a lower conductivity material, such as tin, reduces the quality factor (Q) of the via, which is inversely proportional to the resistance of the via. Resistance is inversely proportional to conductivity of the material used to plate the via, thus a lower conductivity material results in a lower quality factor for the via. A via can be modeled as a transmission line at high frequencies, for example frequencies higher than 1 GHz. The relationship between a quality factor of a via, the resistance of a via, and a frequency of a signal communicated through the via is given by the relationships in equations 1-3 below:

$$QL_{via} \propto \frac{\omega L_{via}}{R_{via}} \quad \text{(Eq. 1)}$$

$$QC_{via} \propto \frac{1}{\omega C_{via} R_{via}} \quad \text{(Eq. 2)}$$

$$Q_{via} \propto \frac{1}{\frac{1}{QL_{via}} + \frac{1}{QC_{via}}} \quad \text{(Eq. 3)}$$

In equations 1-3, $Q_{via}$, represents a quality factor for a via, $QL_{via}$ represents a quality factor for an inductance of the via, $QC_{via}$, represents a quality factor for a capacitance of the via, $L_{via}$ represents the inductance of the via, $C_{via}$ represents the capacitance of the via, $R_{via}$ represents a resistance of the via, and ω represents a frequency of a signal communicated through the via.

As the conductivity of the material used to plate a via decreases, the resistance of the via increases. According to the relationships shown above, an increased resistance of the via decreases a quality factor of the via. A reduced quality factor represents a dampening of the resonance of the via stub. Dampening the resonance of the via reduces the variation in attenuation of a signal as a function of frequency.

Figure 2:
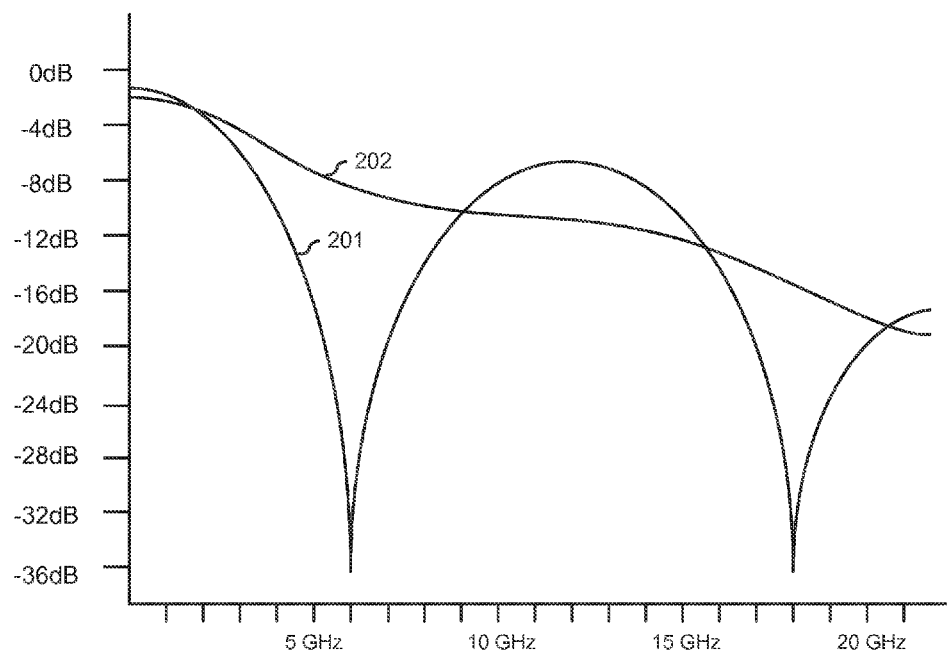
FIG. 2 is a diagram of signal loss vs. frequency according to an embodiment of the present disclosure.

FIG. 2 is a diagram 200 illustrating attenuation of a signal communicated through a via having a via stub with a length corresponding to one quarter of a wavelength of a 6 GHz signal. The attenuation is shown as a function of a frequency of the signal communicated through the via. The vertical axis shows the attenuation measured in decibels (dB). A value of zero (0) dB represents no attenuation. The horizontal axis represents a frequency of the signal. A signal can contain a plurality of frequencies. Each frequency of a signal can be attenuated to a different degree according to attenuation curves 201 and 202. The Nyquist frequency of a discrete signal is defined in the art as one-half of the sampling rate of the signal. A signal will have a strong frequency component at its Nyquist frequency. In addition, the signal can have strong frequency components at frequencies greater than the Nyquist frequency. When the resonant frequency of a via stub is approximately equal to the Nyquist frequency of the signal, one or more frequency components of a signal communicated through the via can be strongly attenuated. In an embodiment, the resonant frequency and the Nyquist frequency are determined to be approximately equal when a difference between the resonant frequency and the Nyquist frequency is less than a threshold amount.

Attenuation curve 201 shows the attenuation produced by a via plated with a highly conductive material. The highly conductive material can be copper or a similar material. For example, a signal having a frequency of 6 GHz is strongly attenuated based on the Nyquist frequency of the signal and the resonant frequency of the via stub, as the reflected and non-reflected signals have approximately similar strengths. Attenuation curve 201 illustrates a signal at 6 GHz attenuated by −36 dB. Signals having frequencies that are odd multiples of 6 GHz are also strongly attenuated. Signals having frequencies not approximately equal to 6 GHz or to odd multiples of 6 GHz are less strongly attenuated.

Attenuation curve 202 shows the attenuation produced by a via plated with a less conductive material, according to an embodiment of the present disclosure. As discussed above, lower conductivity of the material used to plate the via increases the resistance of the via and decreases the quality factors of the via. As shown at attenuation curve 202, signals having frequencies of 6 GHz or of odd multiples of 6 GHz are attenuated to a lesser degree by a via plated with a lower conductivity material as compared with a via plated with a higher conductivity material.

Plating a via with a lower conductivity material can result in attenuation of a signal propagated through the via at frequencies other than the resonant frequency of the via. At a frequency of 0 (zero) Hz, equivalent to a direct current, attenuation curve 202 show a signal loss of approximately 1 dB compared to attenuation curve 201. Similarly, at frequencies in a range around 12 GHz, attenuation curve 202 shows greater signal attenuation than attenuation curve 201, indicating greater signal loss when using a lower conductivity material to plate a via. In an embodiment, the loss due to the use of a lower conductivity material to plate a via can be in the range of 0.5 to 1 dB at 0 Hz. In an embodiment, an equalization circuit at the receiver of a signal compensates for the attenuation of a signal due to plating a via with a lower conductivity material. Equalization circuits suitable for correcting a small signal loss are well known in the art.

Those skilled in the art will appreciate that a printed circuit board constructed according the present disclosure can have more trace layers or fewer trace layers that illustrated in FIG. 1. Embodiments of the present disclosure can have additional playing layers on the top and bottom surfaces of the printed circuit board, on the interior surface of a via of the printed circuit board, or both on the surfaces and on an interior surface a via of the printed circuit board. For example, exposed conductive surfaces of a printed circuit board can be given a protective plating of another material. In an embodiment, the protective plating material can be a metallic material. In an embodiment, the protective plating can be a non-metallic material.

Figure 3:
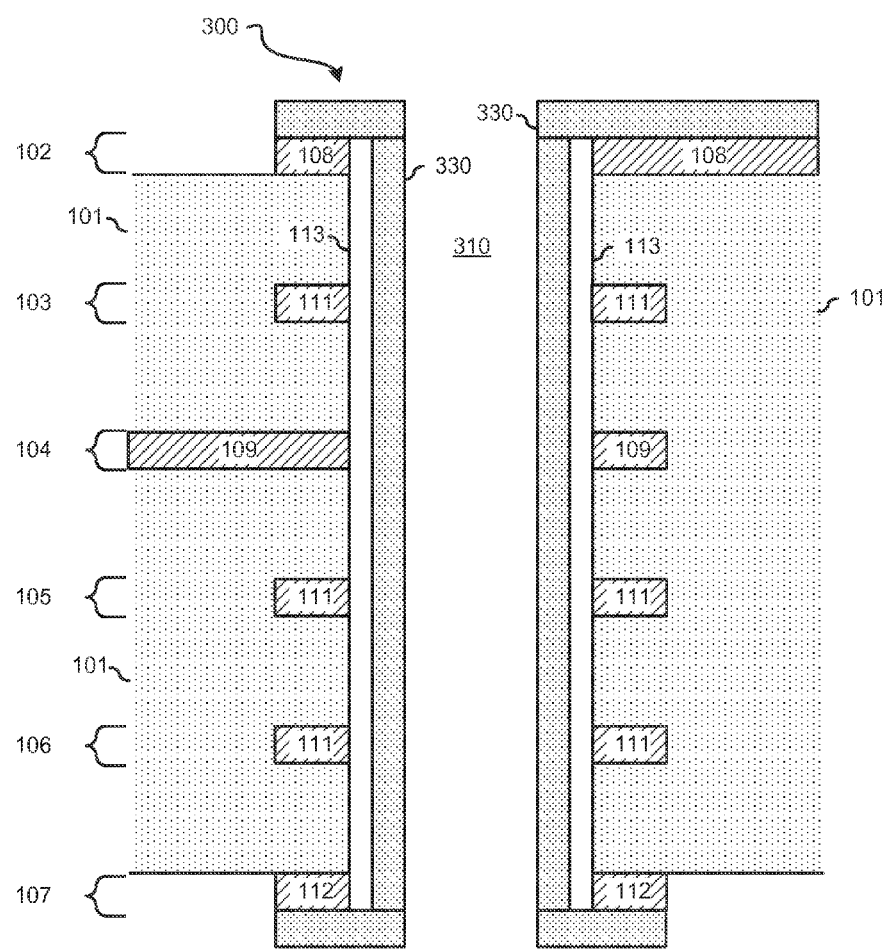
FIG. 3 is diagram of a cross section of a printed circuit board according to another embodiment of the present disclosure.

FIG. 3 shows another cross-section diagram of the multilayer printed circuit board 100 of the information handling system 10. Printed circuit board 300 includes via 310 and plating layer 330. Printed circuit board 100 also includes resin 101, trace layers 102-107, metal traces 108 and 109, metal 111, metal 112, and conductive material 113 as described above with respect to FIG. 1. In different embodiments, via 310 can be a different embodiment of via 110, shown in FIG. 1, or can be a separate via from that of via 110 in printed circuit board 100. Plating layer 330 is deposited on exposed conductive surfaces of the printed circuit board 100, including metal trace 108, conductive material 113, and metal 112 on the bottom surface.

In this embodiment, the conductive material 113 can be tin or another lower conductivity material to reduce the attenuation at resonant frequencies of the original signal caused by the reflected signal in the combined signal exiting via 310 at metal trace 109. The plating layer 330 can be a higher conductive material, such as copper, to increase the signal provided from trace 108 to trace 109. Therefore, the combination of the conductive material 113 and the plating layer 330 can provide a combined signal on metal trace 109 that is less attenuated at resonant frequencies as compared to a combined signal in a printed circuit board 100 without the plating layer 330.

Figure 4:
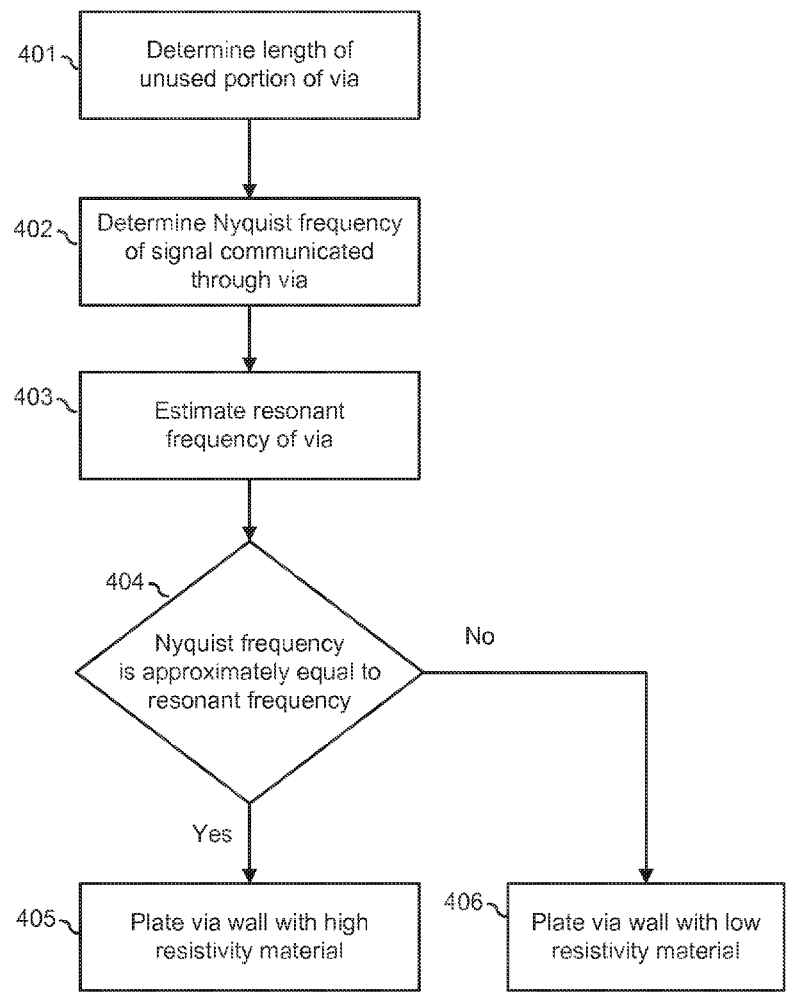
FIG. 4 is a flow diagram of a method for constructing a via in a printed circuit board according to an embodiment of the present disclosure.

FIG. 4 shows a flow diagram 400 illustrating an embodiment of a method for determining a plating material for a via in a printed circuit board. At step 401, the length of an unused portion of a via is determined. The unused portion of the via is a portion that is not between a trace layer on the via at which a signal enters the via and a trace layer on the via at which the signal exists the via. For example, at via 110 a signal can enter the via at metal trace 108 and exit at metal trace 109, as shown in FIG. 1. Alternatively, a signal can enter the via 110 at metal trace 109 and exit at metal trace 108. A portion of the via 110 between trace layer 104 and trace layer 107 is not used for carrying a signal directly between metal traces 108 and 109. The unused portion can be referred to as a via stub. The length of the unused portion of via 110 is the length of the via from trace layer 104 to trace layer 107. The length of an unused portion of a via is determined by the layout of the printed circuit board. In an embodiment, the lengths of unused portions of vias can be computed by printed circuit board layout software.

At step 402, the Nyquist frequency of a signal communicated through the via is determined. The Nyquist frequency of a discrete signal is defined in the art as one-half of the sampling rate of the signal. A signal will have a strong frequency component at its Nyquist frequency. In addition, the signal can have strong frequency components at frequencies greater than the Nyquist frequency. In an embodiment, power spectrum harmonics of the signal can be calculated in addition to the Nyquist frequency. In an embodiment, a signal propagated through a via carries serial data as part of a serializer/deserializer functional blocks on the printed circuit board. The detailed frequency spectrum of the signal will depend on the data transmitted. However, the signal can have strong components at frequencies as calculated at step 402.

At step 403, a resonant frequency of the unused portion of the via is calculated or estimated. The resonant frequency is defined as the frequency with a wavelength of four times the length of the unused portion of the via. This relationship is given by equation 4 below:

$$F_R = \frac{1}{(4*L*t_{prop})} \quad \text{(Eq. 4)}$$

In equation 4, $F_r$ is the resonant frequency, L is the length of the unused portion of the via as calculated at step 401, and $t_{prop}$ is a time for the signal to propagate in a standard length of a material used to plate the via. In embodiment, a value of $t_{prop}$ for a high resistivity material, such as copper, is used. The length L and the propagation time $t_{prop}$ must be in compatible units such that their product has units of seconds. For example, the length can be measured in meters and the propagation time in seconds per meter. The right side of the equation then has units of seconds$^{-1}$, or hertz (Hz). Hertz is a common unit of frequency.

At step 404 the resonant frequency of the via stub computed at step 403 is compared with the Nyquist frequency of a signal communicated through the via as determined at step 402. As discussed with respect to FIG. 2, when the resonant frequency is approximately equal to the Nyquist frequency, one or more frequency components of a signal communicated through the via can be strongly attenuated. In an embodiment, the resonant frequency and the Nyquist frequency are determined to be approximately equal when a difference between the resonant frequency and the Nyquist frequency is less than a threshold amount. In response to the resonant frequency and the Nyquist frequency being approximately equal, the method proceeds to step 405. At step 405, the wall of the via is plated with a high resistivity material. In an embodiment, the high resistivity material can be tin. In response to the resonant frequency and the Nyquist frequency being not approximately equal, the method proceeds to step 406. At step 406, the wall of the via is plated with a low resistivity material. In various embodiments, the low resistivity material can be copper or the conductive material of a trace layer of the printed circuit board.

In an embodiment, all vias of a printed circuit board are plated with a high resistivity material in response to a particular one of the vias having a resonant frequency approximately equal to the Nyquist frequency of a signal communicated through the particular one of the vias. In an embodiment, the method of FIG. 4 is performed for each via of the printed circuit board independently. In this embodiment, a first via of the printed circuit board can be plated with a high resistivity material and a second via of the printed circuit board can be plated with a low resistivity material.

Those skilled in the art will appreciate that the method of FIG. 4 can be extended to use a middle resistivity material having a resistivity between a high resistivity material and a low resistivity material. The method of FIG. 4 can be modified to include testing the difference between the resonant frequency and the Nyquist frequency a plurality of times. For example, in response to the difference for a via being less than a first threshold, the via can be plated with a high resistivity material. In response to the difference for a via being greater than the first threshold and less than a second threshold the via can be plated with a middle resistivity material.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board, comprising:
   a first trace in a first conductive layer;
   a second trace in a second conductive layer;
   a first via to interconnect the first trace and the second trace, the first via to communicate a first signal from the first trace to the second trace through a third conductive layer plated on a wall of the first via, wherein the third conductive layer has a conductive material with a higher impedance than the first conductive layer and the second conductive layer; and
   a plating layer deposited over the first trace and the third conductive layer, wherein the plating layer has a lower impedance than the conductive material of the third conductive layer.

2. The printed circuit board of claim 1, wherein the first via is a through via.

3. The printed circuit board of claim 1, wherein a resistivity of the third conductive layer is greater than a resistivity of the first conductive layer and of the second conductive layer.

4. The printed circuit board of claim 3, wherein:
   the first conductive layer communicates the first signal in a first conductive material; and
   the first via communicates the first signal in a second conductive material.

5. The printed circuit board of claim 4, wherein the second conductive material comprises tin.

6. The printed circuit board of claim 1, further comprising:
   a third trace;
   a fourth trace; and
   a second via coupling the third trace to the fourth trace, wherein:
      the first via communicates the first signal in a first conductive material;
      the second via communicates a second signal in a second conductive material; and
      the first conductive material and the second conductive material are different types of materials.

7. An information handling system, comprising:
   a processor; and
   a printed circuit board coupled to the processor, the printed circuit board including:

a first trace in a first conductive layer coupled to the processor, the first conductive layer including a first conductive material to communicate a signal from the processor;

a second trace in a second conductive layer coupled to a signal load, the second conductive layer including the first conductive material;

a first via to interconnect the first trace and the second trace, the first via to communicate the signal from the first trace to the second trace through a third conductive layer plated on a wall of the first via, wherein the third conductive layer includes a second conductive material that has a higher impedance than the first conductive material; and a plating layer deposited over the first trace and the third conductive layer, wherein the plating layer has a lower impedance than the second conductive material of the third conductive layer.

8. The information handling system of claim 7, wherein the first via is a through via.

9. The information handling system of claim 7, wherein the second conductive material is selected based on a resonant frequency of a stub end of the first via.

10. The information handling system of claim 7, further comprising:
a third trace;
a fourth trace; and
a second via coupling the third trace to the fourth trace, wherein:
the first via communicates the first signal in a first conductive material;
the second via communicates a second signal in a second conductive material; and
the first conductive material and the second conductive material are different types of materials.

11. The information handling system of claim 7, further comprising:
an equalizer circuit coupled to the first via.

12. The information handling system of claim 7, wherein the second conductive material is tin.

13. A printed circuit board, comprising:
a first trace in a first conductive layer;
a second trace in a second conductive layer;
a first via to interconnect the first trace and the second trace, the first via to communicate a first signal from the first trace to the second trace through a third conductive layer plated on a wall of the first via, wherein the third conductive layer has a conductive material with a higher impedance than the first conductive layer and the second conductive layer; and
a plating layer deposited over the first trace and the third conductive layer, wherein the plating layer has a lower impedance than the conductive material of the third conductive layer;
wherein the first via is a through via; and
a resistivity of the third conductive layer is greater than a resistivity of the first conductive layer and of the second conductive layer.

14. The printed circuit board of claim 13, wherein:
the first conductive layer communicates the first signal in a first conductive material; and
the first via communicates the first signal in a second conductive material.

15. The printed circuit board of claim 14, wherein the second conductive material comprises tin.

16. The printed circuit board of claim 13, further comprising:
a third trace;
a fourth trace; and
a second via coupling the third trace to the fourth trace, wherein:
the first via communicates the first signal in a first conductive material;
the second via communicates a second signal in a second conductive material; and
the first conductive material and the second conductive material are different types of materials.

* * * * *